(12) United States Patent
Gardner et al.

(10) Patent No.: US 11,721,592 B2
(45) Date of Patent: Aug. 8, 2023

(54) METHOD OF MAKING VERTICAL SEMICONDUCTOR NANOSHEETS WITH DIFFUSION BREAKS

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 130 days.

(21) Appl. No.: 17/480,318

(22) Filed: Sep. 21, 2021

(65) Prior Publication Data

US 2022/0254689 A1  Aug. 11, 2022

Related U.S. Application Data

(60) Provisional application No. 63/147,290, filed on Feb. 9, 2021, provisional application No. 63/147,454, filed
(Continued)

(51) Int. Cl.
*H01L 21/8234* (2006.01)
*H01L 29/06* (2006.01)
(Continued)

(52) U.S. Cl.
CPC ........ *H01L 21/823487* (2013.01); *H01L 21/823878* (2013.01); *H01L 21/823885* (2013.01);
(Continued)

(58) Field of Classification Search
CPC ..... H01L 21/823487; H01L 21/823885; H01L 21/823481; H01L 21/823878; H01L 21/823807; H01L 29/7827; H01L 29/78642; H01L 29/66666; H01L 29/0676; H01L 29/0653; H01L 29/41741; H01L 27/1207; H01L 27/1203; H01L 27/12

See application file for complete search history.

(56) References Cited

U.S. PATENT DOCUMENTS 6,753,216 B2 * 6/2004 Mathew ............ H01L 29/78621
438/318
7,638,381 B2  12/2009 Cheng et al.
(Continued)

*Primary Examiner* — Michael M Trinh
(74) *Attorney, Agent, or Firm* — Oblon, McClelland, Maier & Neustadt, L.L.P.

(57) ABSTRACT

A method of microfabrication includes providing a substrate having a first layer including a first semiconductor material. A second layer of a second semiconductor material is formed over the first layer. The second layer is directionally etched using a mask to form independent core structures of the second semiconductor material on the first semiconductor material. A third layer of a first dielectric material is formed on an exposed surface of the first layer to cover a lower portion of a respective sidewall of each core structure. A shell structure is formed on an upper portion of a respective sidewall of each core structure to form shell structures including at least one semiconductor material. The core structures are removed such that each shell structure forms a vertical semiconductor structure extending vertically from the first layer and electrically isolated from the first semiconductor material by the first dielectric material.

20 Claims, 16 Drawing Sheets

Related U.S. Application Data on Feb. 9, 2021, provisional application No. 63/147,455, filed on Feb. 9, 2021.

(51) Int. Cl.
  *H01L 29/78* (2006.01)
  *H01L 29/66* (2006.01)
  *H01L 21/8238* (2006.01)
  *H01L 29/423* (2006.01)
  *H01L 29/417* (2006.01)

(52) U.S. Cl.
  CPC ...... *H01L 29/0653* (2013.01); *H01L 29/0676* (2013.01); *H01L 29/41741* (2013.01); *H01L 29/42392* (2013.01); *H01L 29/66666* (2013.01); *H01L 29/7827* (2013.01); *H01L 29/7831* (2013.01)

(56) References Cited

U.S. PATENT DOCUMENTS

| | | | |
|---|---|---|---|
| 7,800,152 B2* | 9/2010 | Zhu | H01L 29/66795 |
| | | | 257/E29.183 |
| 2007/0082437 A1* | 4/2007 | Cheng | H01L 29/785 |
| | | | 438/197 |
| 2011/0021027 A1* | 1/2011 | Johnson | H01L 21/3086 |
| | | | 438/694 |
| 2016/0071929 A1* | 3/2016 | Bentley | H01L 29/0649 |
| | | | 438/283 |
| 2020/0135545 A1* | 4/2020 | Srivastava | H01L 21/76825 |
| 2022/0359312 A1* | 11/2022 | Fulford | H01L 29/7827 |

\* cited by examiner

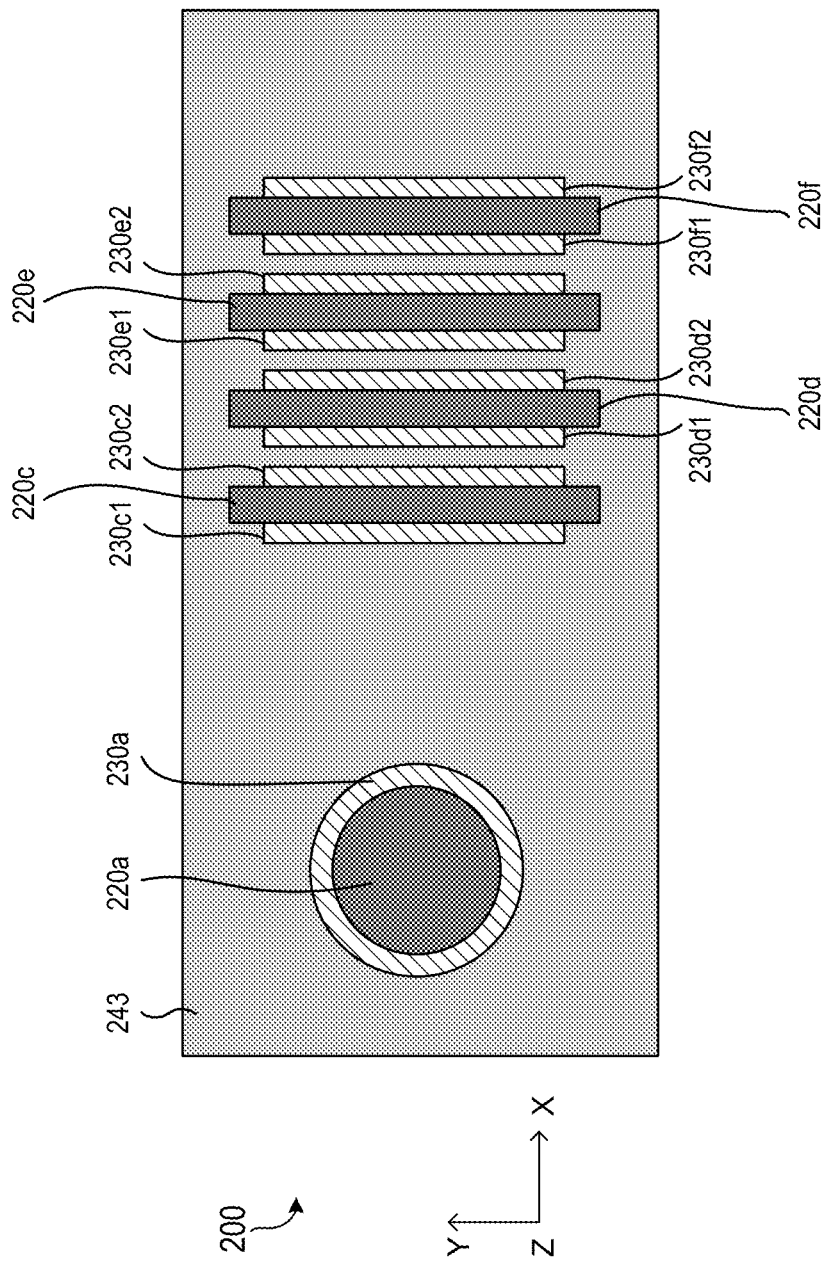

METHOD OF MAKING VERTICAL SEMICONDUCTOR NANOSHEETS WITH DIFFUSION BREAKS

INCORPORATION BY REFERENCE

This present disclosure claims the benefit of U.S. Provisional Applications Nos. 63/147,290, 63/147,454 and 63/147,455 filed on Feb. 9, 2021, each of which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a method of microfabrication.

An aspect (1) includes a method of microfabrication. The method includes providing a substrate having a first layer including a first semiconductor material. A second layer of a second semiconductor material is formed over the first layer. The second layer is directionally etched using a mask to form independent core structures of the second semiconductor material on the first semiconductor material. Each independent core structure has a sidewall extending from an exposed surface of the first layer. A third layer of a first dielectric material is formed on the exposed surface of the first layer to cover a lower portion of a respective sidewall of each core structure with the first dielectric material. A shell structure is formed on an upper portion of a respective sidewall of each core structure to form shell structures that include at least one type of semiconductor material. The core structures are removed such that each shell structure forms a vertical semiconductor structure which extends vertically from the first layer and is electrically isolated from the first semiconductor material by the first dielectric material.

An aspect (2) includes the method of aspect (1), wherein the forming the shell structure includes forming at least one continuous shell structure surrounding the upper portion of the sidewall of a respective core structure such that the continuous shell structure forms a closed shape in a plane parallel to the first layer.

An aspect (3) includes the method of aspect (2), wherein the removing the core structures includes removing the respective core structure from within the continuous shell structure to form a hollow vertical semiconductor structure which extends vertically from the first layer.

An aspect (4) includes the method of aspect (2), wherein the closed shape is circular, elliptical or polygonal.

An aspect (5) includes the method of aspect (1), wherein the forming the shell structure includes forming at least one discontinuous shell structure including independent sub-shell structures extending around the upper portion of the sidewall of a respective core structure such that the discontinuous shell structure forms a broken shape in a plane parallel to the first layer.

An aspect (6) includes the method of aspect (5), wherein the removing the core structures includes removing the respective core structure from within the discontinuous shell structure to form independent vertical semiconductor structures which extend vertically from the first layer.

An aspect (7) includes the method of aspect (5), wherein the respective core structure is polygonal in a plane parallel to the first layer. The independent sub-shell structures are formed on different sides of a respective polygon.

An aspect (8) includes the method of aspect (5), further including forming a dielectric isolation between the independent sub-shell structures.

An aspect (9) includes the method of aspect (1), wherein the directionally etching the second layer using the mask includes forming a plurality of core structures including shapes of prisms having horizontal bases and vertical faces. The horizontal bases are circular, elliptical or polygonal.

An aspect (10) includes the method of aspect (1), wherein the forming the shell structure includes forming a first group of the shell structures on a first group of the upper portions of the sidewalls of the core structures while a second group of the upper portions of the sidewalls of the core structures is protected. The first group of the shell structures includes a third semiconductor material.

An aspect (11) includes the method of aspect (10), further including forming a second group of the shell structures on the second group of the upper portions of the sidewalls of the core structures while the first group of the shell structures is protected. The second group of the shell structures includes a fourth semiconductor material.

An aspect (12) includes the method of aspect (11), wherein the third semiconductor material and the fourth semiconductor material include different semiconductor materials, or the third semiconductor material and the fourth semiconductor material include a same semiconductor material but are doped differently.

An aspect (13) includes the method of aspect (1), wherein the forming the third layer of the first dielectric material includes depositing the first dielectric material to cover the first layer. A portion of the first dielectric material is removed so that the upper portions of the sidewalls of the core structures are uncovered.

An aspect (14) includes the method of aspect (1), wherein the forming the third layer of the first dielectric material includes depositing the first dielectric material to cover the first layer and the sidewalls of the core structures. A portion of the first dielectric material is removed using an etching mask so that the upper portions of the sidewalls of the core structures are partially uncovered.

An aspect (15) includes the method of aspect (1), wherein the removing the core structures includes replacing the core structures with an insulating material by etching the core structures and depositing the insulating material.

An aspect (16) includes the method of aspect (1), further including forming a capping layer over the second layer so that top surfaces of the core structures are covered by the capping layer.

An aspect (17) includes the method of aspect (1), wherein each shell structure includes a vertical channel that is configured to have a current flow path in a vertical direction perpendicular to the first layer.

An aspect (18) includes the method of aspect (1), wherein the first semiconductor material and the second semiconductor material are etch selective relative to each other. The core structures and the shell structures are etch selective relative to each other.

An aspect (19) includes the method of aspect (1), further including forming the shell structure by epitaxial growth.

An aspect (20) includes the method of aspect (1), further including forming the second layer over the first layer by epitaxial growth.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 6C shows a cross-sectional view taken along the line cut CC' in FIG. 6A, in accordance with another embodiment of the present disclosure.

DETAILED DESCRIPTION

Figure 1:
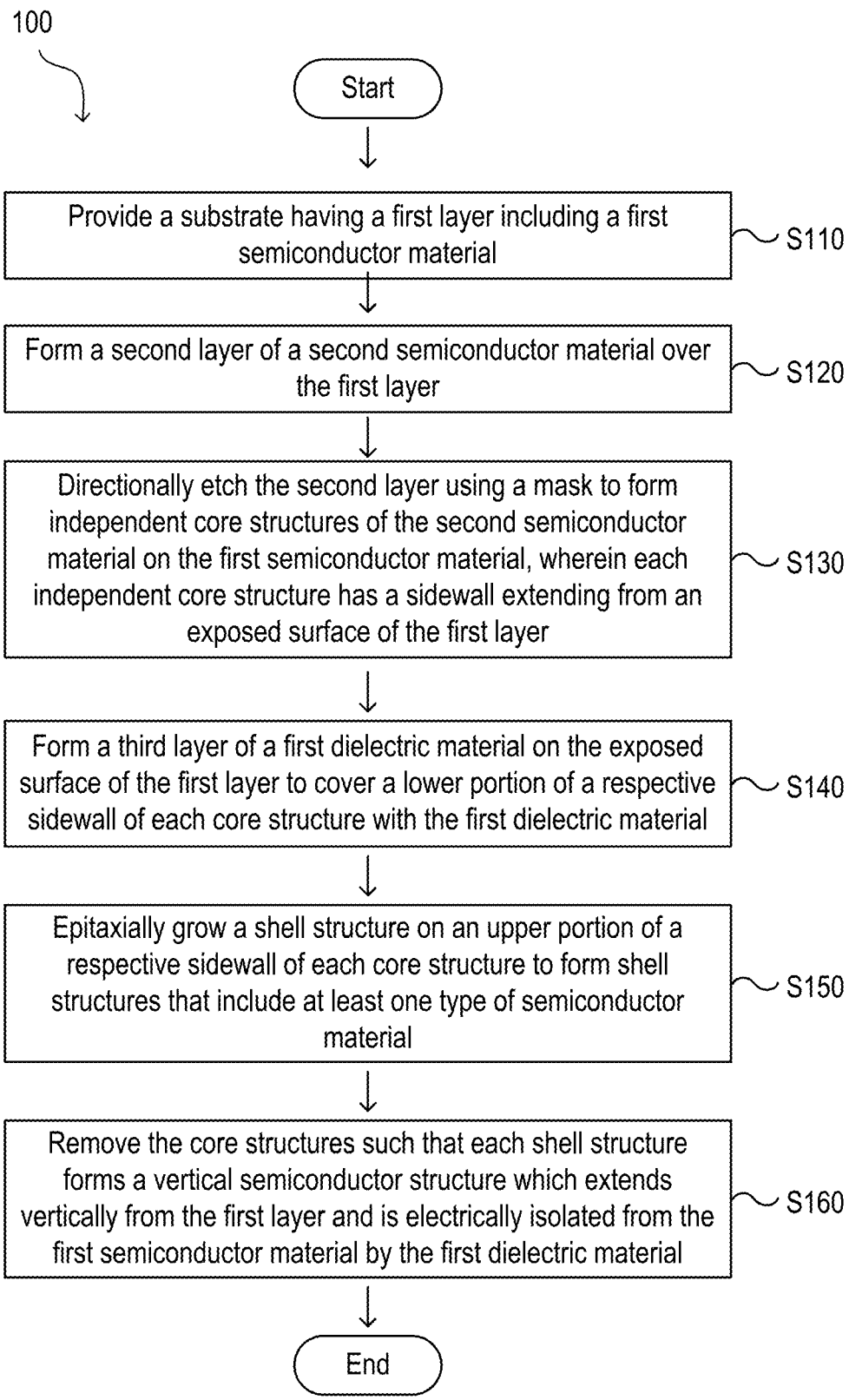
FIG. 1 shows a flow chart of an exemplary process of microfabrication, in accordance with exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (e.g. CPU (central processing unit), GPU (graphics processing unit), FPGA (field programmable gate array, SoC (System on a chip), etc.) is being pursued.

Techniques herein include methods for making vertical 3D semiconductor nanosheets with 3D vertical and horizontal diffusion breaks. 3D vertical transistors can be made with 3D vertical nanosheets to precisely control high mobility materials. Any type of epitaxial semiconductor material of vertical nanosheet can be made with techniques herein by placing two or more epitaxial layers together that are selective (etch selective) to each other. Techniques include a method of making 3D nanosheets such that semiconductor C or D will be different than semiconductor A or semiconductor B. That is, techniques herein include a method of making 3D nanosheets such that a vertical semiconductor structure can be chemically different from an underlying horizontal semiconductor layer.

Techniques also include a process to make diffusion breaks for 3D vertical isolation, including a horizontal diffusion break between nanosheets and a vertical diffusion break between the nanosheets and an underlying semiconductor layer. This enables different 3D vertical stack material types to enable NMOS and PMOS without channel release (e.g. Si vertical nanosheets for NMOS, and SiGe or Ge nanosheets for PMOS). According to some aspects of the present disclosure, shell structures can be configured to include vertical channels, and core structures positioned inside the shell structures can be removed. Shapes of 3D nanosheets achieved herein can include various prisms, such as cylindrical prisms, elliptical prisms, rectangular prisms, etc. Invention flow of different types of vertical nanosheets is disclosed for optimum 3D device layout with diffusion breaks. In some examples, any substrate that is single crystal silicon on the top surface may be selected for use with these methods.

One embodiment of techniques herein include a method of making vertical 3D semiconductor nanosheets with vertical and horizontal diffusion breaks for optimum NMOS semiconductor materials. Silicon is shown as an invention example, but any selective semiconductor material can be used. Another embodiment includes a method of making vertical 3D semiconductor nanosheets with vertical and horizontal diffusion breaks for optimum PMOS materials. Ge is shown as an invention example, but any selective semiconductor material can be used.

FIG. 1 shows a flow chart of a process 100 of microfabrication, in accordance with exemplary embodiments of the present disclosure. The process 100 starts with Step S110 by providing a substrate having a first layer including a first semiconductor material. At Step S120, a second layer of a second semiconductor material is formed over the first layer. At Step S130, the second layer is directionally etched using a mask to form independent core structures of the second semiconductor material on the first semiconductor material. Each independent core structure has a sidewall extending from an exposed surface of the first layer. At Step S140, a third layer of a first dielectric material is formed on the exposed surface of the first layer to cover a lower portion of a respective sidewall of each core structure with the first dielectric material. At Step S150, a shell structure is epitaxially grown on an upper portion of a respective sidewall of each core structure to form shell structures that include at least one type of semiconductor material. At Step S160, the core structures are removed such that each shell structure forms a vertical semiconductor structure which extends vertically from the first layer and is electrically isolated from the first semiconductor material by the first dielectric material. In some embodiments, each shell structure includes a vertical channel that is configured to have a current flow path in the vertical direction perpendicular to the first layer.

"Shell structure" as used herein may be continuous or discontinuous. The shell structure can form at least one of a closed shape or a broken shape in a plane parallel to a working surface of the substrate, such as the first layer. "Nanosheet" as used herein includes, but is not limited to, a flat nanosheet. The nanosheet can also include a curved nanosheet, and the curved nanosheet may form a closed shape in a plane parallel to the working surface of the substrate, such as the first layer. The description may reference particular types of shell structures and nanosheets, but this is for illustrative purposes only.

"Epitaxial growth", "epitaxial deposition", "epitaxially grown", "epitaxially formed" or "epitaxy" as used herein generally refers to a type of crystal growth or material deposition in which a crystalline layer is formed over a seed layer that is crystalline. Crystalline characteristics (e.g. crystal orientation) of the crystalline layer are related to or dictated by crystalline characteristics of the seed layer. Particularly, a semiconductor material can be epitaxially grown on a surface of another semiconductor layer that is crystalline. In some embodiments, epitaxial growth can be selective such that a semiconductor material may only be epitaxially grown on another semiconductor surface and generally do not deposit on exposed surfaces of non-semiconductor materials, such as silicon oxide, silicon nitride, and the like. Epitaxial growth can be accomplished by molecular beam epitaxy, vapor-phase epitaxy, liquid-phase epitaxy, or the like. Si, SiGe, Ge and other semiconductor materials can be doped during epitaxial growth (in situ) by addition of dopants. For example in vapor-phase epitaxy, a dopant vapor can be added to the gas source.

FIGS. 2A, 3A, 4A, 5A, 6A, 7A and 8A show cross-sectional views of a semiconductor device 200 at various intermediate steps of manufacturing, in accordance with exemplary embodiments of the present disclosure.

Figure 2A:
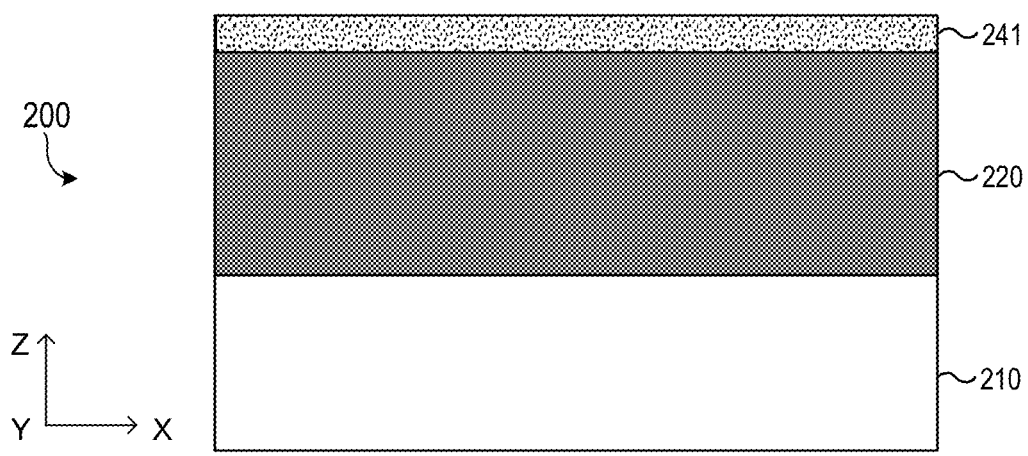
FIGS. 2A, 3A, 4A, 5A, 6A, 7A and 8A show cross-sectional views of a semiconductor device at various intermediate steps of manufacturing, in accordance with exemplary embodiments of the present disclosure.

As shown in FIG. 2A, the semiconductor device 200 includes a first layer 210 and a second layer 220 formed over the first layer 210. The first layer 210 includes a first semiconductor material, and the second layer 220 includes a second semiconductor material. In some embodiments, the first layer 210 functions as a base layer so that the second layer 220 can be epitaxially grown on the first layer 210. The first semiconductor material and the second semiconductor material can be selected to be etch selective relative to each other. That is, the second layer 220 can be etched or patterned without etching or patterning the first layer 210. In one embodiment, the first layer 210 includes silicon (Si) while the second layer 220 includes germanium (Ge) or silicon germanium (SiGe). In another embodiment, the first layer 210 includes Ge while the second layer 220 includes SiGe. Note that Si, Ge and SiGe are common examples of semiconductor materials, and the first layer 210 and the second layer 220 may include other semiconductor materials that are etch selective to each other.

In some embodiments, the first layer 210 is positioned over an insulator disposed on a substrate (not shown). That is, an epitaxial layer of the first semiconductor material is grown on a substrate having a dielectric layer disposed thereon. Thus, the second layer 220 can be formed on an SOI (silicon-on-insulator), a GeOI (Germanium-on-insulator), an SGOI (SiGe-on-insulator) or the like. In some embodiments, the first layer 210 can include completed devices with isolated silicon on top. In some embodiments, the first layer 210 includes single crystal silicon at a top surface of the first layer 210. The single crystal silicon can function as a seed layer for epitaxially growing a semiconductor layer thereon.

In some embodiments, a capping layer 241 is formed over the second layer 220. For example, the capping layer 241 can include a hard mask material such as TiN and thus function as a hard mask during etching. The capping layer 241 may also function as a passivation material to block epitaxial growth.

Figure 3A:
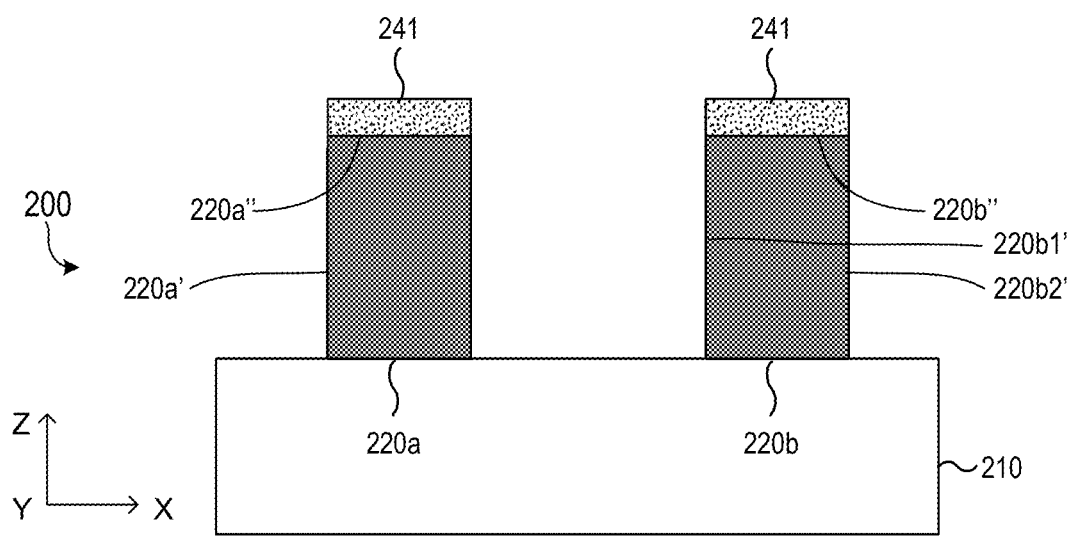

In FIG. 3A, independent core structures (e.g. 220a and 220b) of the second semiconductor material are formed over the first layer 210. In a non-limiting example, the independent core structures are formed by a directional etch using a mask. Because the first semiconductor material and the second semiconductor material are etch selective, the directional etch can stop at an interface between the first layer 210 and the second layer 220. Shapes of the core structures include prisms having horizontal bases and vertical faces (also referred to as sidewalls).

The horizontal bases can be circular, elliptical or polygonal. Further, shapes, lateral dimensions, height and spacing of the core structures can be adjusted to meet specific design requirements.

Figure 3B:
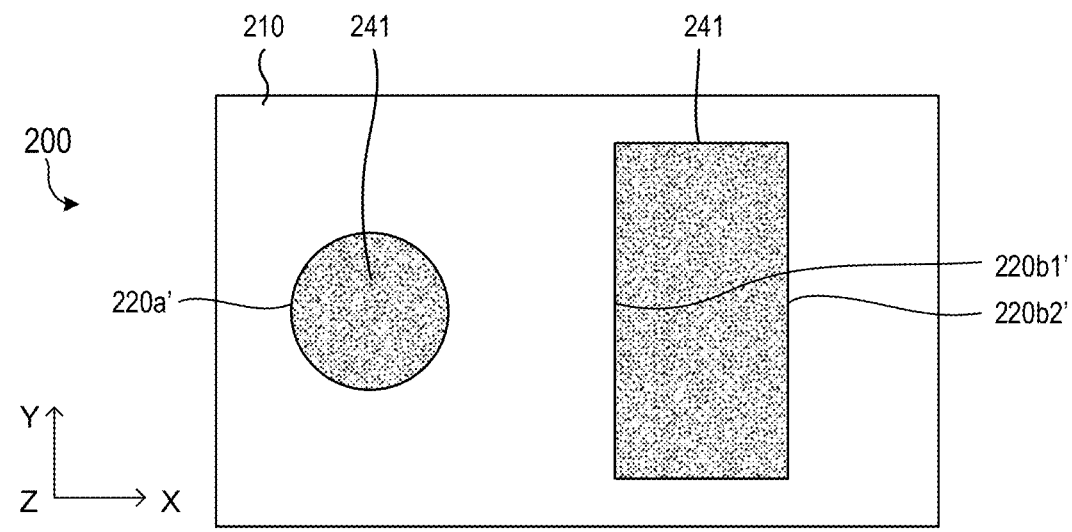
FIG. 3B shows a top view of the semiconductor device in FIG. 3A, in accordance with one embodiment of the present disclosure.

FIG. 3B shows a top view of the semiconductor device 200 in FIG. 3A, in accordance with one embodiment of the present disclosure. In the example of FIG. 3B, the core structure 220a has a shape of a circular prism, i.e. a prism having circular bases. The core structure 220b has a shape of a polygonal prism, i.e. a prism having polygonal bases. It should be understood that other shapes of prisms can also be formed. Note that the drawings are not to scale, but merely show relative positions of structures. For example, while the core structures and the capping layer 241 may appear to be "relocated" in FIG. 3B compared with FIG. 3A, the core structures and the capping layer 241 are not relocated. Other drawings may show similar "false" relocation.

Each independent core structure can have a sidewall extending from an exposed surface of the first layer 210. In the examples of FIGS. 3A and 3B, sidewalls (e.g. 220a', 220b1' and 220b2') of the core structures (e.g. 220a and 220b) are exposed. Top surfaces (e.g. 220a" and 220b") are covered by the capping layer 241. In one example, the capping layer 241 is masked, and the second layer 220 is etched to define vertical 3D semiconductor regions (e.g. SiGe or Ge). In one example, when the second layer 220 is formed on an SOI, etching can be stopped on the insulator (e.g. an oxide layer) followed by photoresist removal.

Figure 4A:
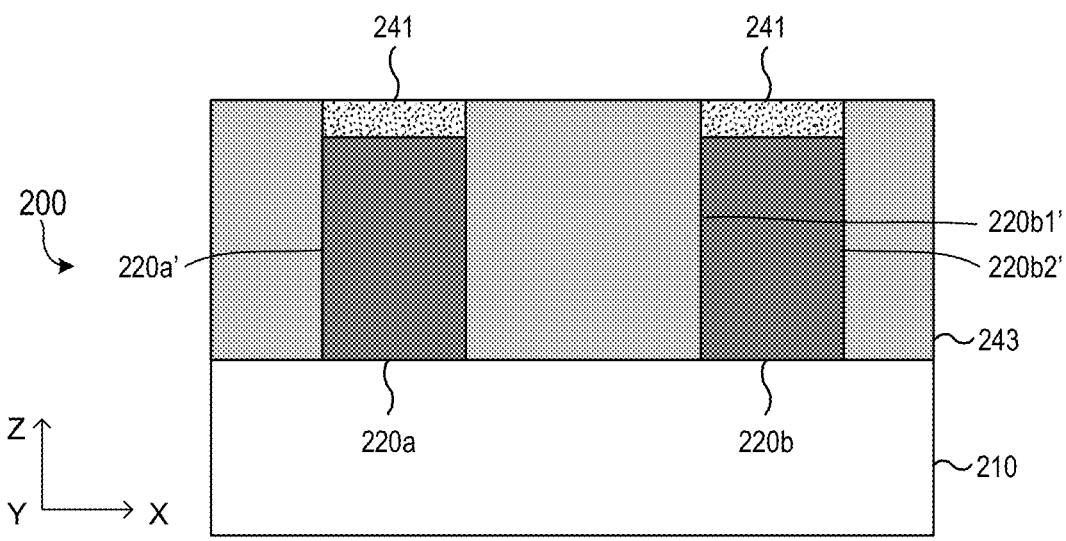
Figure 4B:
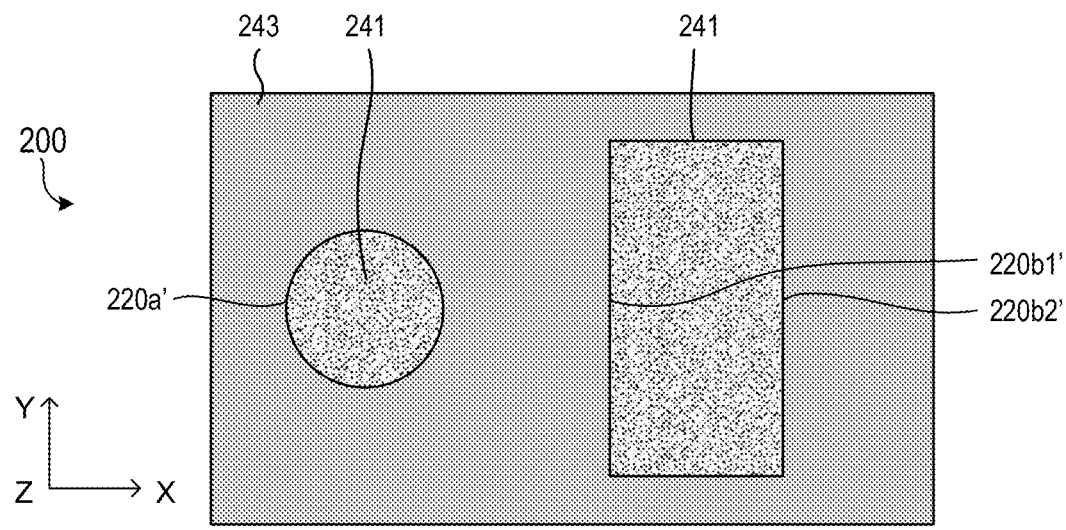
FIG. 4B shows a top view of the semiconductor device in FIG. 4A, in accordance with one embodiment of the present disclosure.

In FIG. 4A, a third layer of a first dielectric material 243 is formed to cover the first layer 210 and sidewalls (e.g. 220a', 220b1' and 220b2') of the core structures (e.g. 220a and 220b). For example, this can be accomplished by an overfill of the first dielectric material 243, followed by planarization by chemical-mechanical polishing (CMP). FIG. 4B shows a top view of the semiconductor device 200 in FIG. 4A, in accordance with one embodiment of the present disclosure. In this embodiment, the CMP stops at the capping layer 241.

Figure 4C:
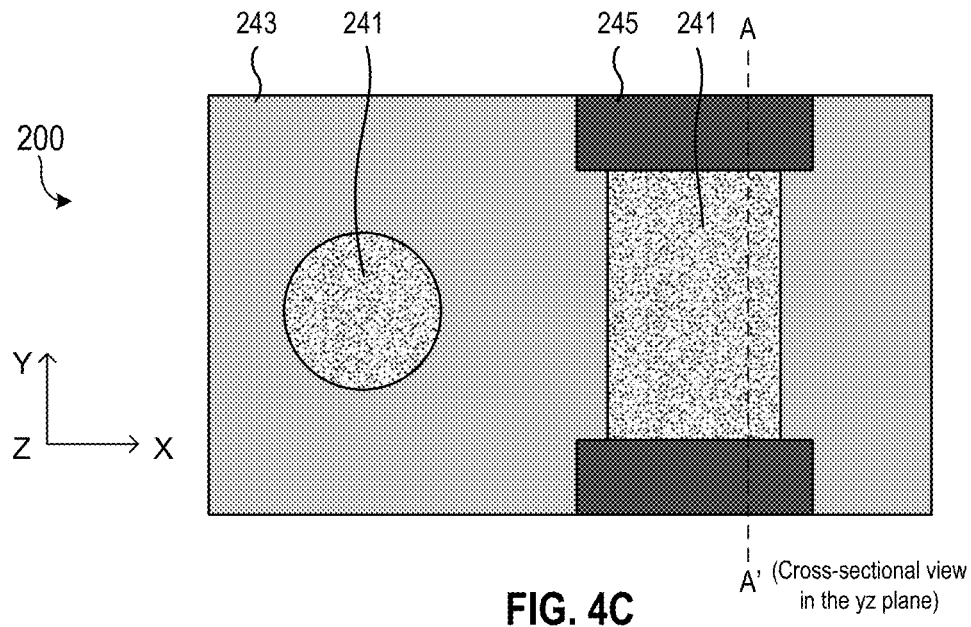
FIG. 4C shows a top view of the semiconductor device in FIG. 4A after an optional step, in accordance with one embodiment of the present disclosure.
Figure 4D:
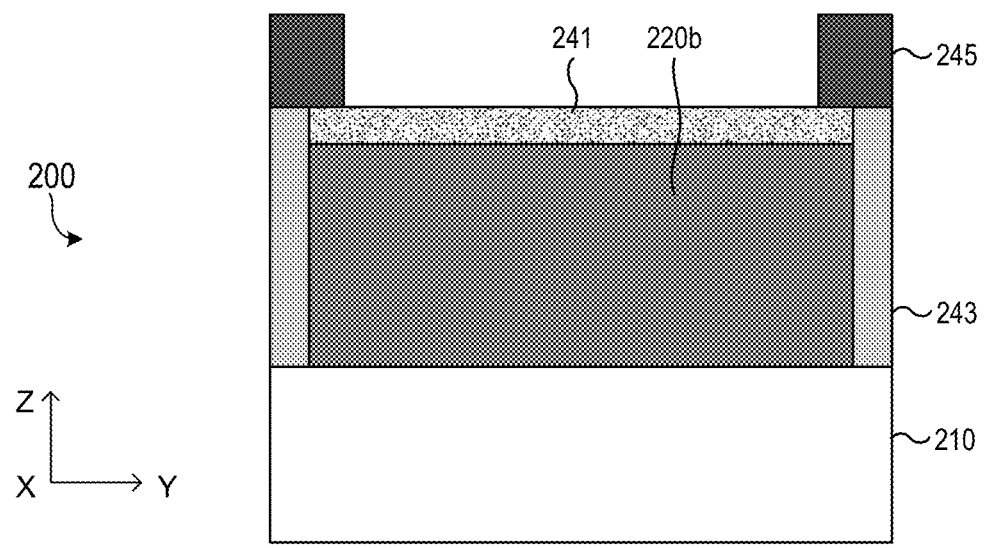
FIG. 4D shows a cross-sectional view taken along the line cut AA' in FIG. 4C, in accordance with one embodiment of the present disclosure.

In some embodiments, a mask layer 245 can be optionally formed to cover part of the core structure 220b, as shown in FIG. 4C. FIG. 4D shows a cross-sectional view taken along the line cut AA' in FIG. 4C, in accordance with one embodiment of the present disclosure. As illustrated, two ends of the core structure 220b are covered by the mask layer 245.

Figure 4E:
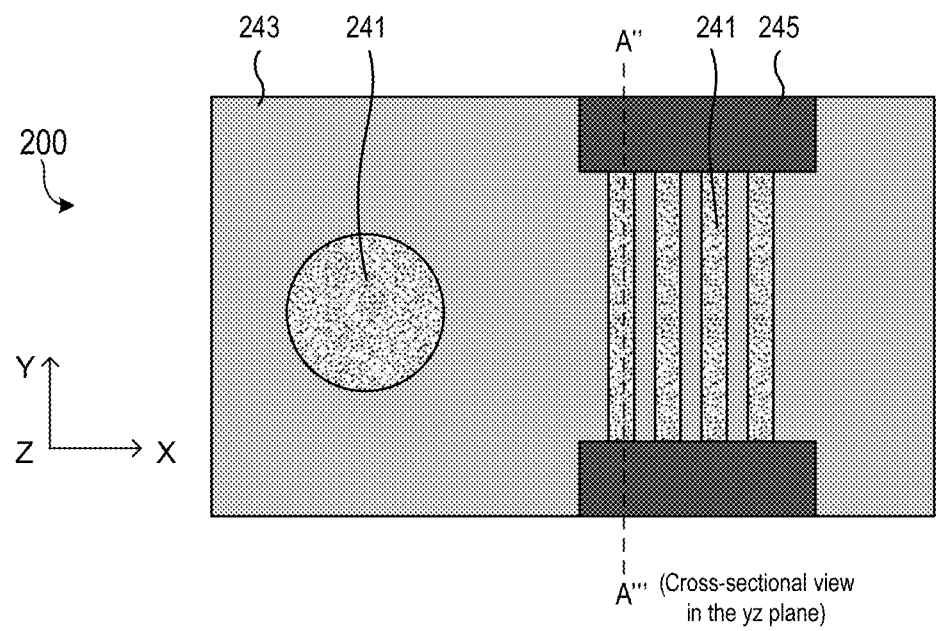
FIG. 4E shows a top view of the semiconductor device in FIG. 4A after an optional step, in accordance with another embodiment of the present disclosure.

Note that various regions of a given circuit being fabricated with techniques herein can have different spacing and sizes for vertical nanosheets. In some embodiments, an etch mask can be added and the substrate etched for multiple nanosheets. In the example of FIG. 4E, a plurality of (e.g. four) core structures (not shown) is arranged in an array. As shown, a mask layer 245 can be optionally formed to cover opposing ends of the plurality of core structures. In one embodiment, FIG. 4D can show a cross-sectional view taken along the line cut A"A'" in FIG. 4E.

Figure 5A:
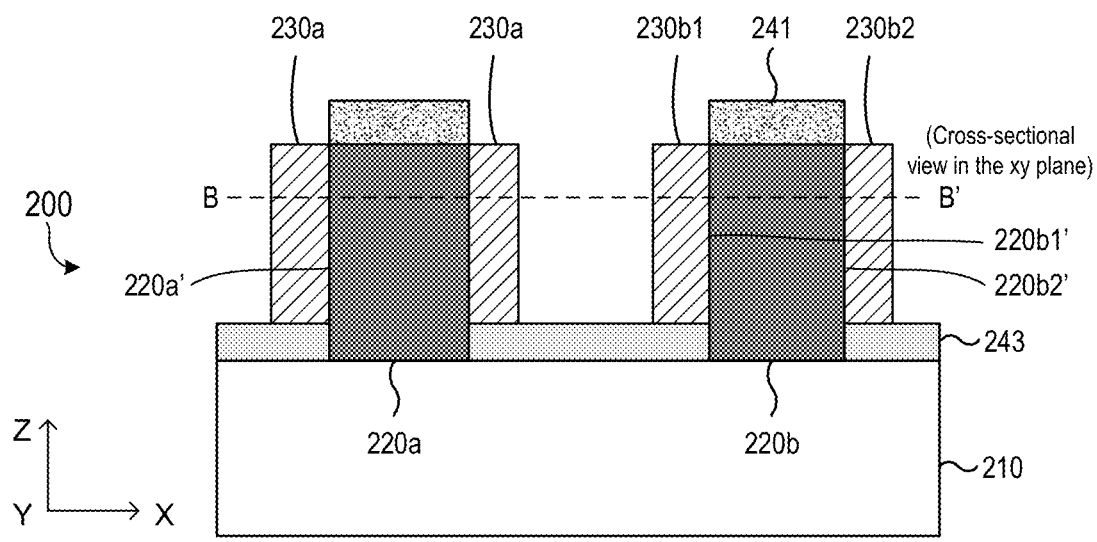
Figure 5B:
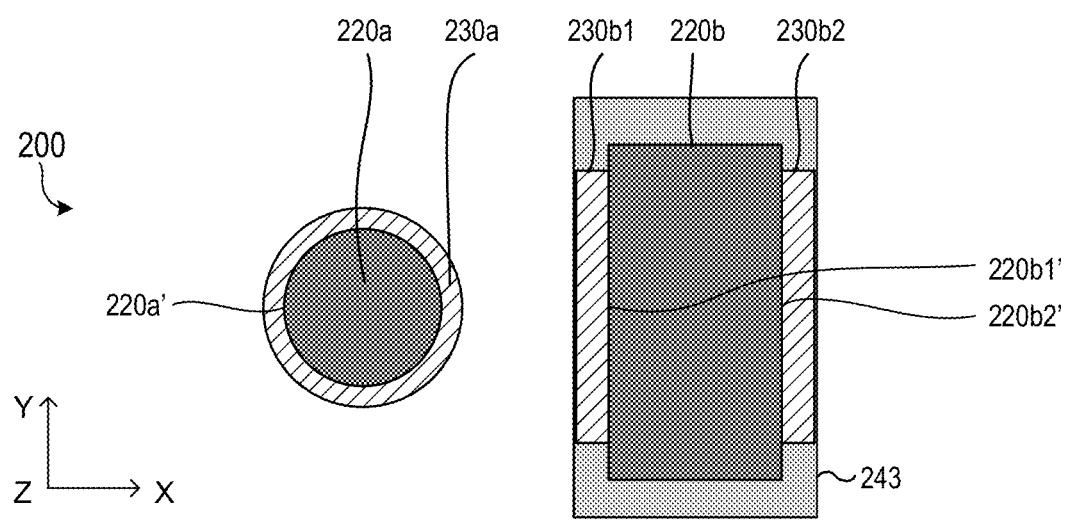
FIG. 5B shows a cross-sectional view taken along the line cut BB' in FIG. 5A, in accordance with one embodiment of the present disclosure.

In some embodiments, FIG. 5A shows the semiconductor device 200 in FIGS. 4C and 4D after etching back the first dielectric material 243 using the mask layer 245 as an etching mask, forming shell structures and removing the mask layer 245. Specifically, in FIG. 5A, the first dielectric material 243 is etched back so that lower portions of the sidewalls (e.g. 220a', 220b1' and 220b2') of the core structures (e.g. 220a and 220b) are covered by the first dielectric material 243, and shell structures, such as 230a and 230b (shown by 230b1 and 230b2), are formed on upper portions of the sidewalls (e.g. 220a', 220b1' and 220b2') of the core structures (e.g. 220a and 220b). Then, the mask layer 245 is removed. As a result, the shell structures are separated from the first layer 210 by the first dielectric material 243. FIG. 5B shows a cross-sectional view taken along the line cut BB' in FIG. 5A, in accordance with one embodiment of the present disclosure.

In some embodiments, a portion of the first dielectric material 243 is removed so that the upper portions of the sidewalls (e.g. 220a') of the core structures (e.g. 220a) are uncovered. As a result, at least one continuous shell structure (e.g. 230a) surrounding (or all around) the upper portion of the sidewall of a respective core structure (e.g. 220a) can be formed such that the continuous shell structure (e.g. 230a) forms a closed shape in a plane parallel to the first layer 210. In the example of FIG. 5B, the shell structure 230a has a closed shape in a horizontal cross section in the xy plane, which is parallel to the horizontal bases of the corresponding circular prism. The closed shape of the shell structure 230a in the horizontal cross section is circular. In other embodiments, the closed shape may be elliptical or polygonal (e.g. rectangular). In some embodiments, thicknesses of the shell structures (e.g. 230a) can be controlled such that the shell structures (e.g. 230a) form vertical nanosheets. In one embodiment, epitaxial Si (N+, P+ or intrinsic) is grown to form a three-dimensional (3D) 360° vertical shell around a SiGe core. In another embodiment, epitaxial Ge is grown to form a 3D 360° vertical shell around a SiGe core.

In some embodiments, a portion of the first dielectric material 243 is removed using an etching mask (e.g. the mask layer 245 in FIGS. 4C and 4D) so that the upper portions of the sidewalls of the core structures (e.g. 220b) are partially uncovered. The first dielectric material 243 can function as a passivation material. As a result, at least one discontinuous shell structure (e.g. 230b) including independent sub-shell structures (e.g. 230b1 and 230b2) extending around the upper portion of the sidewall of a respective core structure (e.g. 220b) can be formed such that the discontinuous shell structure (e.g. 230b) forms a broken shape in a plane parallel to the first layer 210. In the example of FIG. 5B, the core structure 220b is polygonal in a plane parallel to the first layer 210, and the independent sub-shell structures 230b1 and 230b2 are formed on different sides of the polygon. Thicknesses of the sub-shell structures 230b1 and 230b2 can be controlled such that the sub-shell structures 230b1 and 230b2 form vertical nanosheets. As shown, the shell structure 230b forms a broken shape in a horizontal cross section in the xy plane parallel to the horizontal bases of the corresponding rectangular prism. The broken shape includes two parallel straight segments. In other embodiments, the broken shape may include at least one of a straight segment or a curved segment. A given broken shape may include any number of segments which may or may not be parallel to each other.

In some embodiments, while not shown, the shell structures may include a plurality of parallel nanosheets arranged in an array. For example, eight parallel nanosheets can be formed by etching back the first dielectric material 243 in FIG. 4E and forming shell structures on uncovered parts of the upper portions of the sidewalls of the core structures. Additionally, a shell structure having a closed shape of a rectangle in the xy plane can be formed by etching back the first dielectric material 243 in FIG. 4B and forming the shell structure all around the upper portions of the sidewalls of the core structure 220b.

Still referring to FIG. 5A, the shell structures (e.g. 230a and 230b) can include a third semiconductor material and be formed by epitaxial growth. In some embodiments, the second semiconductor material and the third semiconductor material are etch selective relative to each other. In one embodiment, the first semiconductor material includes Si; the second semiconductor material includes Ge or SiGe; and the third semiconductor material includes Si. In another embodiment, the first semiconductor material includes Si; the second semiconductor material includes $SiGe_x$; and the third semiconductor material includes Ge or $SiGe_y$. Note that $SiGe_x$ and $SiGe_y$ are chemically different from each other so that $SiGe_x$ and $SiGe_y$ can have etch selectivity during processing. For example, $SiGe_x$ and $SiGe_y$ can have different ratios of Si to Ge. In addition, other combinations of semiconductor materials can also be implemented by techniques herein. Further, the shell structures can also include a semiconducting oxide (e.g. ZnO, CdO, $Ir_2O_3$, etc.) or a 2D semiconductor material (e.g. graphene, boron nitride, $MoS_2$ monolayers, etc.).

Note that FIGS. 4A-4E and 5A-5B show some examples of forming a third layer of a first dielectric material on an exposed surface of the first layer to cover a lower portion of a respective sidewall of each core structure with the first dielectric material and epitaxially growing a shell structure on an upper portion of a respective sidewall of each core structure to form shell structures that include at least one type of semiconductor material. In other examples, the lower portions of sidewalls of the core structures may be covered differently, and the shell structures may be formed differently. For example, the first dielectric material 243 may be deposited to cover the lower portions of sidewalls of the core structures such that no etching back is required.

Figure 6A:
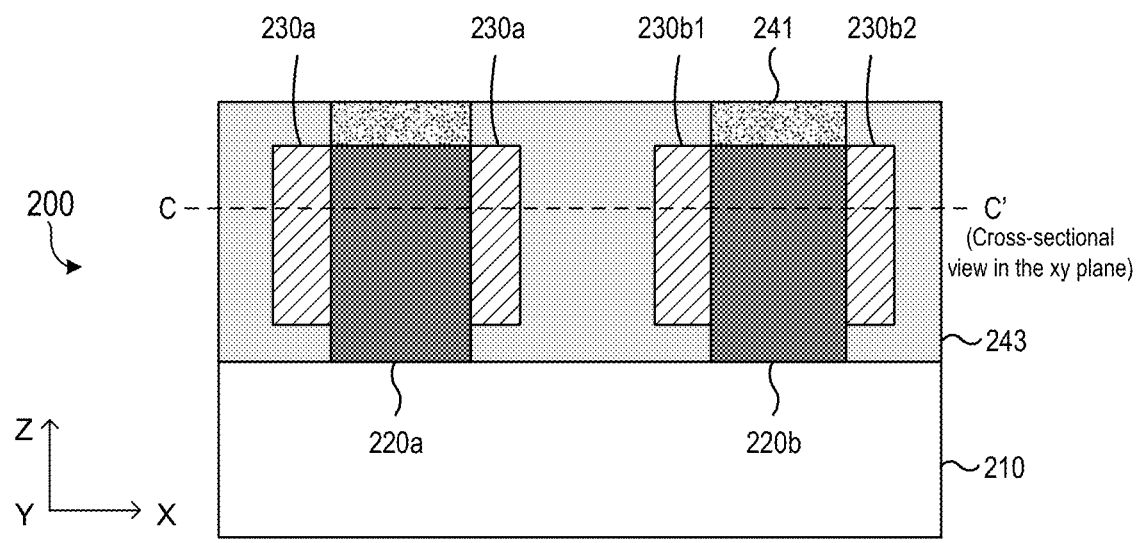

In some embodiments, subsequently, the shell structures (e.g. 230a and 230b) can be surrounded or covered with a second dielectric material. In one example, the second dielectric material may be different from the first dielectric material. In the example of FIG. 6A, the second dielectric material and the first dielectric material are identical, and a CMP process may be used to planarize the second dielectric material.

Figure 6B:
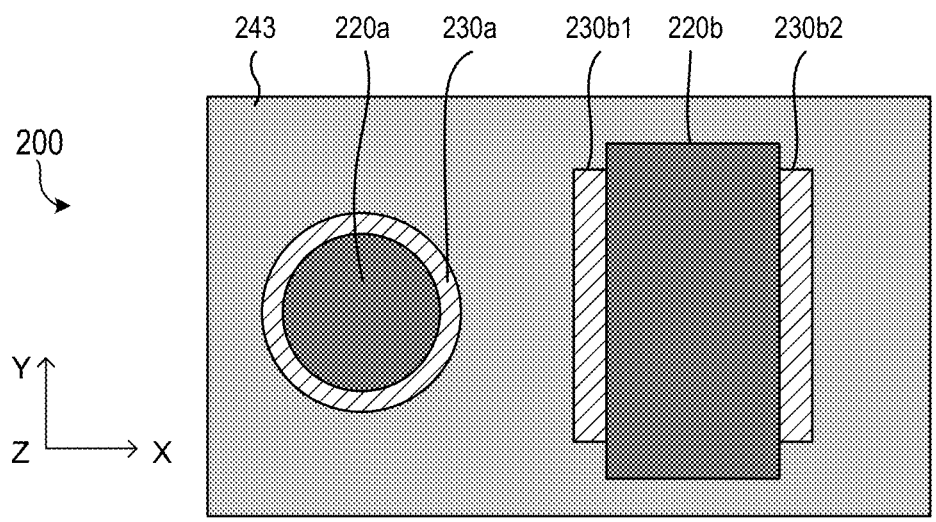
FIG. 6B shows a cross-sectional view taken along the line cut CC' in FIG. 6A, in accordance with one embodiment of the present disclosure.

FIG. 6B shows a cross-sectional view taken along the line cut CC' in FIG. 6A, in accordance with one embodiment of the present disclosure. For example, the semiconductor device 200 in FIG. 6B can be obtained by surrounding the shell structures in FIG. 5B with the second dielectric material.

FIG. 6C shows a cross-sectional view taken along the line cut CC' in FIG. 6A, in accordance with another embodiment of the present disclosure. Herein, the semiconductor device 200 includes a plurality of (e.g. four) core structures (e.g. 220c, 220d, 220e and 220f) arranged in an array. Accordingly, a discontinuous shell structure (e.g. 230c, shown by 230c1 and 230c2) can be formed on different sides of a respective core structure (e.g. 220c). Dimensions and spacing of sub-shell structures (e.g. 230c1, 230c2, 230d1, 230d2, 230e1, 230e2, 230f1 and 230f2) can be adjusted to meet specific design requirements. In addition, the shell structures in FIG. 6C can correspond to the shell structures in FIG. 4E.

Figure 7A:
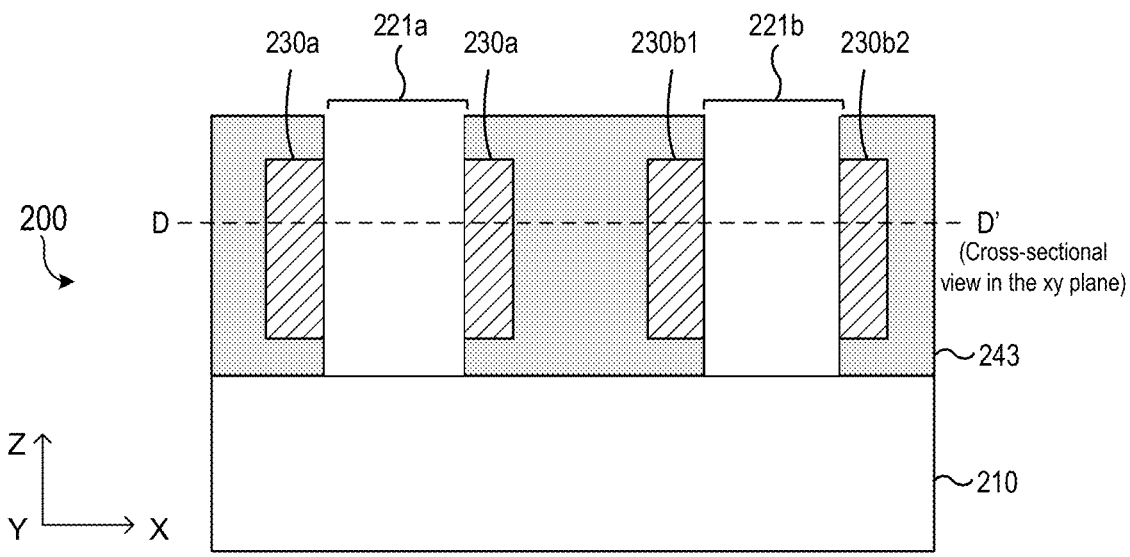

In FIG. 7A, the core structures (e.g. 220a and 220b) are removed such that each shell structure forms a vertical semiconductor structure which extends vertically from the first layer 210 and is electrically isolated from the first semiconductor material by the first dielectric material 243. In some embodiments, the removing the core structures includes removing the respective core structure (e.g. 220a) from within the continuous shell structure (e.g. 230a) to form a hollow vertical semiconductor structure which extends vertically from the first layer 210. In some embodiments, the removing the core structures includes removing the respective core structure (e.g. 220b) from within the discontinuous shell structure (e.g. 230b) to form independent vertical semiconductor structures which extend vertically from the first layer 210.

Figure 7B:
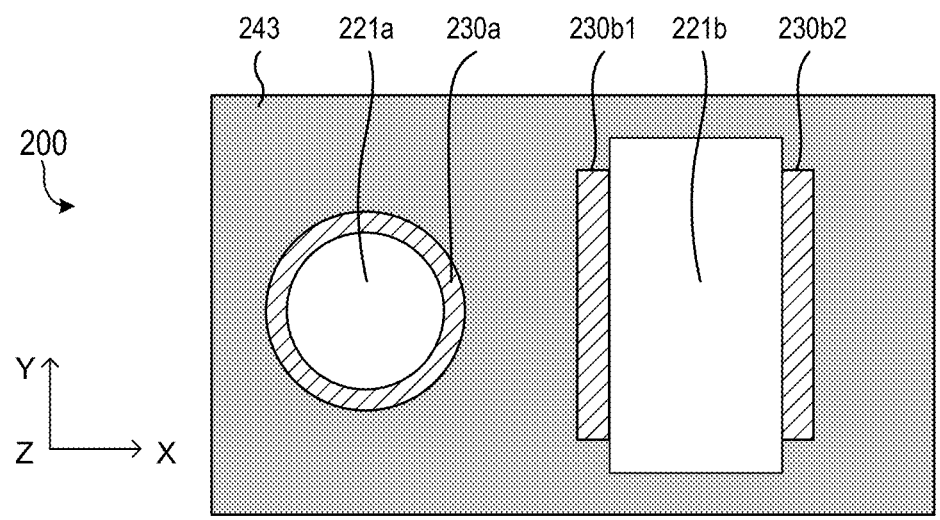
FIG. 7B shows a cross-sectional view taken along the line cut DD' in FIG. 7A, in accordance with one embodiment of the present disclosure.

As a result, holes 221a and 221b are formed. While top surfaces of the shell structures 230a and 230b are covered in the example of FIG. 7A, the top surfaces of the shell structures 230a and 230b may be exposed in other examples. In one embodiment, the second semiconductor material is SiGe and the third semiconductor material is Si. Processes and tools are known for selectively removing SiGe without removing epitaxial Si or other semiconductor materials. FIG. 7B shows a cross-sectional view taken along the line cut DD' in FIG. 7A, in accordance with one embodiment of the present disclosure.

Figure 8A:
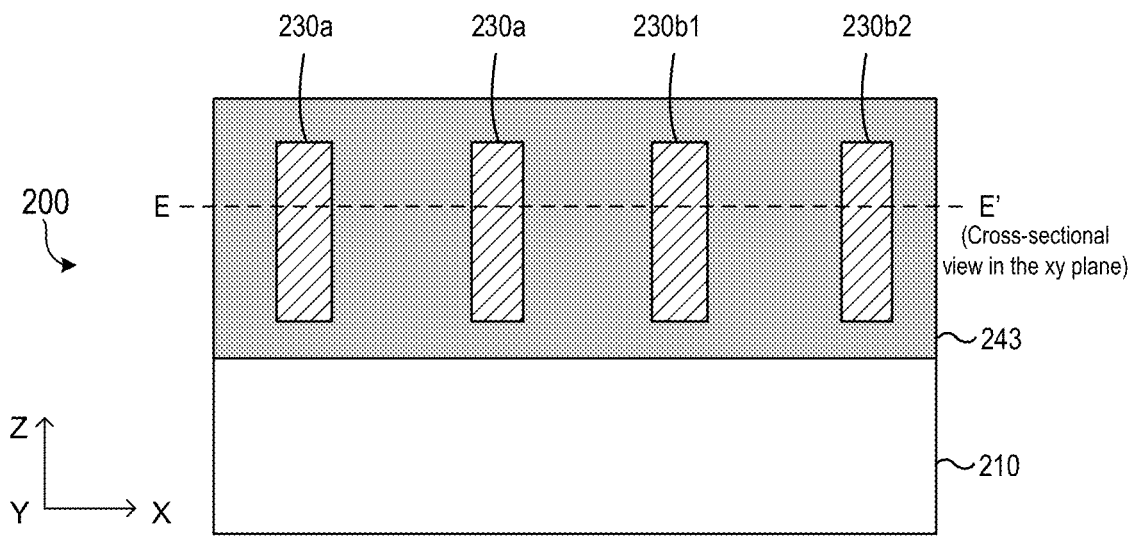
Figure 8B:
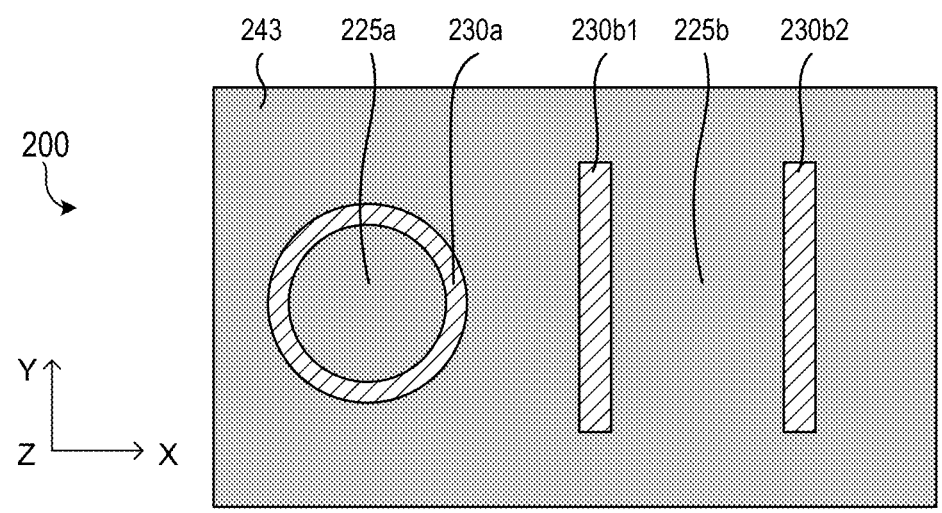
FIG. 8B shows a cross-sectional view taken along the line cut EE' in FIG. 8A, in accordance with one embodiment of the present disclosure.

In FIG. 8A, a third dielectric material is deposited and planarized so that a dielectric isolation is formed between the independent sub-shell structures (e.g. 230b1 and 230b2). The top surfaces of the shell structures (e.g. 230a and 230b) may or may not be uncovered by planarization. FIG. 8B shows a cross-sectional view taken along the line cut EE' in FIG. 8A, in accordance with one embodiment of the present disclosure. As demonstrated, the shell structures (e.g. 230a and 230b) are isolated in both vertical and horizontal directions. That is, the shell structures (e.g. 230a and 230b) are vertically isolated from the first layer 210 by the first dielectric material 243. The shell structures (e.g. 230a and 230b) are horizontally isolated from each other by the second dielectric material. The independent sub-shell structures (e.g. 230b1 and 230b2) are isolated from each other by the third dielectric material. The first dielectric material, the second dielectric material and the third dielectric material can also function as horizontal and vertical diffusion breaks. In the examples of FIGS. 8A and 8B, the first dielectric material, the second dielectric material and the third dielectric material are the same dielectric material, such as silicon oxide.

In some embodiments, each shell structure includes a vertical channel that is configured to have a current flow path in the vertical direction (e.g. the z direction) perpendicular to the first layer 210. In some embodiments, each shell structure includes a source region, the vertical channel and a drain region serially connected in the vertical direction. In one embodiment, the source region, the vertical channel and the drain region are connected with no junction. In other words, at least one shell structure can have a uniform doping profile in the vertical direction. In another embodiment, the source region, the vertical channel and the drain region are connected with junctions. Additional steps may be needed to control doping concentrations in the source region and the drain region.

According to some aspects of the disclosure, the shell structures (e.g. 230a and 230b) in FIGS. 2A-8A can include a single type of semiconductor material. According to some aspects of the disclosure, the shell structures can include more than one type of semiconductor material. For instance, FIGS. 9, 10, 11, 12, 13, 14 and 15 show cross-sectional views of the semiconductor device 200 at various intermediate steps of manufacturing, in accordance with exemplary embodiments of the present disclosure.

Figure 9:
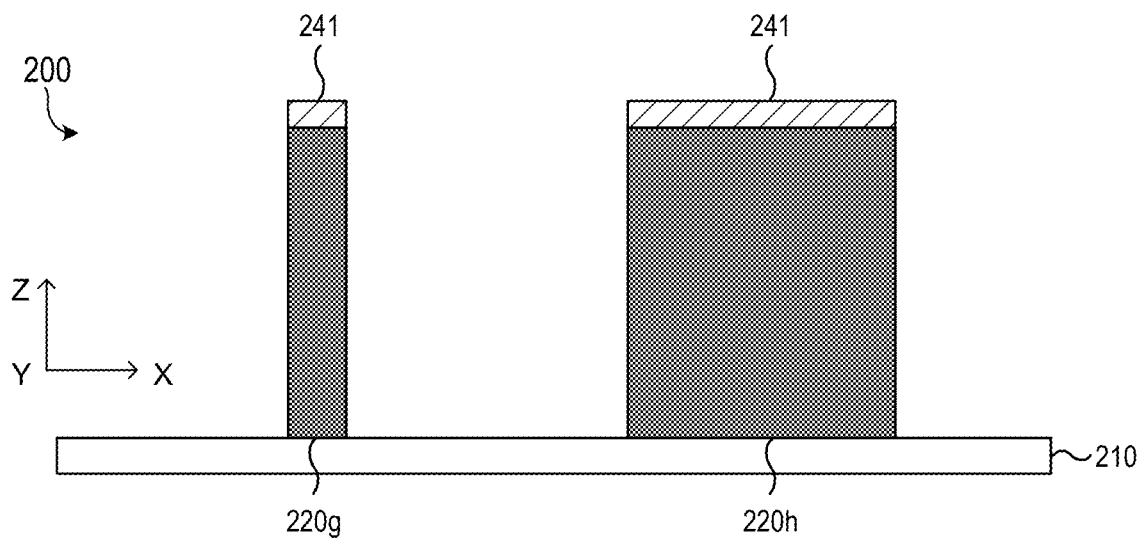
FIGS. 9, 10, 11, 12, 13, 14 and 15 show cross-sectional views of a semiconductor device at various intermediate steps of manufacturing, in accordance with exemplary embodiments of the present disclosure.

In some embodiments, FIG. 9 shows the semiconductor device 200 in FIG. 2A after core structures (e.g. 220g and 220h) are formed over the first layer 210. As has been mentioned before, dimensions, shapes and spacing of the core structures can be adjusted to meet specific design requirements.

In some embodiments, a first group of the shell structures can be formed on a first group of the upper portions of the sidewalls of the core structures while a second group of the upper portions of the sidewalls of the core structures is protected. The first group of the shell structures can include a third semiconductor material and be formed by epitaxial growth. Particularly, in the examples of FIGS. 10 and 11, lower portions of the sidewalls of the core structures 220g and 220h are covered with the first dielectric material 243. A dielectric spacer 251 is formed on the upper portions of the sidewalls of the core structures 220g and 220h. Then, a patterned photoresist layer (not shown) can be deposited over the core structure 220h. The patterned photoresist layer is used as an etching mask for removing the dielectric spacer 251 from the sidewalls of the core structure 220g.

Figure 12:
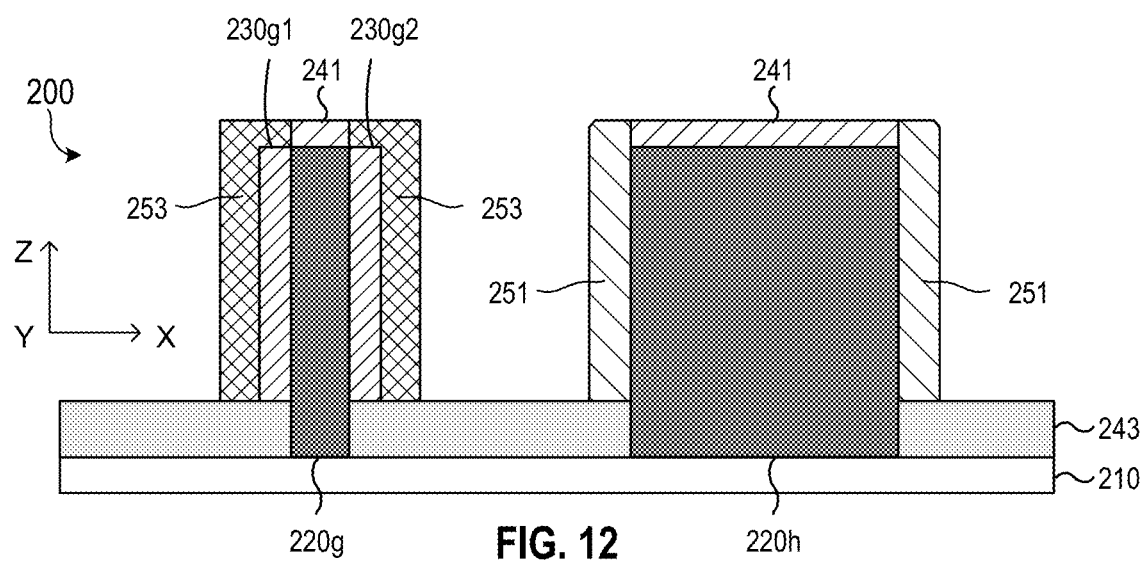

In FIG. 12, a first group of the shell structures (e.g. 230g, shown by 230g1 and 230g2) is formed on a first group of the upper portions of the sidewalls of the core structures (e.g. 220g). Subsequently, the first group of the shell structures (e.g. 230g) can be covered with a high-k dielectric 253. In one embodiment, the shell structure 230g is a continuous shell structure surrounding or all around the upper portions of the sidewall of the core structure 220g, similar to the shell structure 230a. In another embodiment, the shell structure 230g is a discontinuous shell structure including independent sub-shell structures 230g1 and 230g2, similar to the shell structure 230b.

Figure 13:
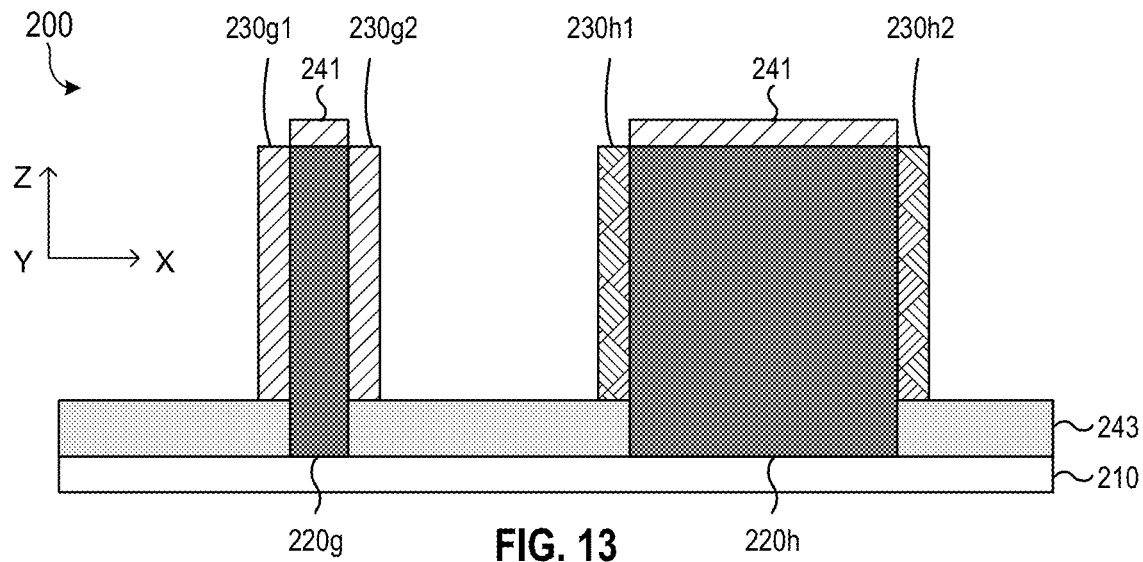

In some embodiments, a second group of the shell structures is formed on the second group of the upper portions of the sidewalls of the core structures while the first group of the shell structures is protected. The second group of the shell structures can include a fourth semiconductor material and be formed by epitaxial growth. Subsequently, the high-k dielectric 253 is removed from the first group of the shell structures. In the example of FIG. 13, the dielectric spacer 251 is removed to uncover the second group of the upper portions of the sidewalls of the core structures (e.g. 220h). Then, a second group of the shell structures (e.g. 230h, shown by 230h1 and 230h2) are formed on the second group of the upper portions of the sidewalls of the core structures (e.g. 220h). The shell structure 230h can be a continuous shell structure similar to the shell structure 230a or a discontinuous shell structure similar to the shell structure 230b.

Further, the first group of the shell structures (e.g. 230g) and the second group of the shell structures (e.g. 230h) can be chemically different from each other. In some embodiments, the third semiconductor material and the fourth semiconductor material include different semiconductor materials. For example, the third semiconductor material can include Ge while the fourth semiconductor material Si. In some embodiments, the third semiconductor material and the fourth semiconductor material include a same semiconductor material but are doped differently, e.g. having different dopant types, different dopant concentrations, etc. For example, the third semiconductor material and the fourth semiconductor material can both include Si, but the third semiconductor material and the fourth semiconductor material may have different dopant types or have a same dopant type but different dopant concentrations.

In one embodiment, the third semiconductor material includes an n-type semiconductor material while the fourth semiconductor material includes a p-type semiconductor material. In another embodiment, the third semiconductor material includes a p-type semiconductor material while the fourth semiconductor material includes an n-type semiconductor material. In a non-limiting example, the first semiconductor material includes Si; the second semiconductor material includes SiGe; the third semiconductor material includes Ge; and the fourth semiconductor material includes Si. Note that other combinations of semiconductor materials can also be implemented by techniques herein.

Still referring to FIG. 13, a third group, a fourth group, a fifth group, etc. (not shown) of the shell structures can be formed similarly. In a non-limiting example, in order to form the third group of the shell structures, a first group of the shell structures can be formed on a first group of the upper portions of the sidewalls of the core structures while a second group and a third group of the upper portions of the sidewalls of the core structures are protected. Then, a second group of the shell structures can be formed on the second group of the upper portions of the sidewalls of the core structures while the first group of the shell structures and the third group of the upper portions of the sidewalls of the core structures are protected. Next, the third group of the shell structures can be formed on the third group of the upper portions of the sidewalls of the core structures while the first group of the shell structures and the second group of the shell structures are protected. As a result, the shell structures can include various semiconductor materials or various vertical semiconductor nanosheets tailored to different uses.

Figure 14:
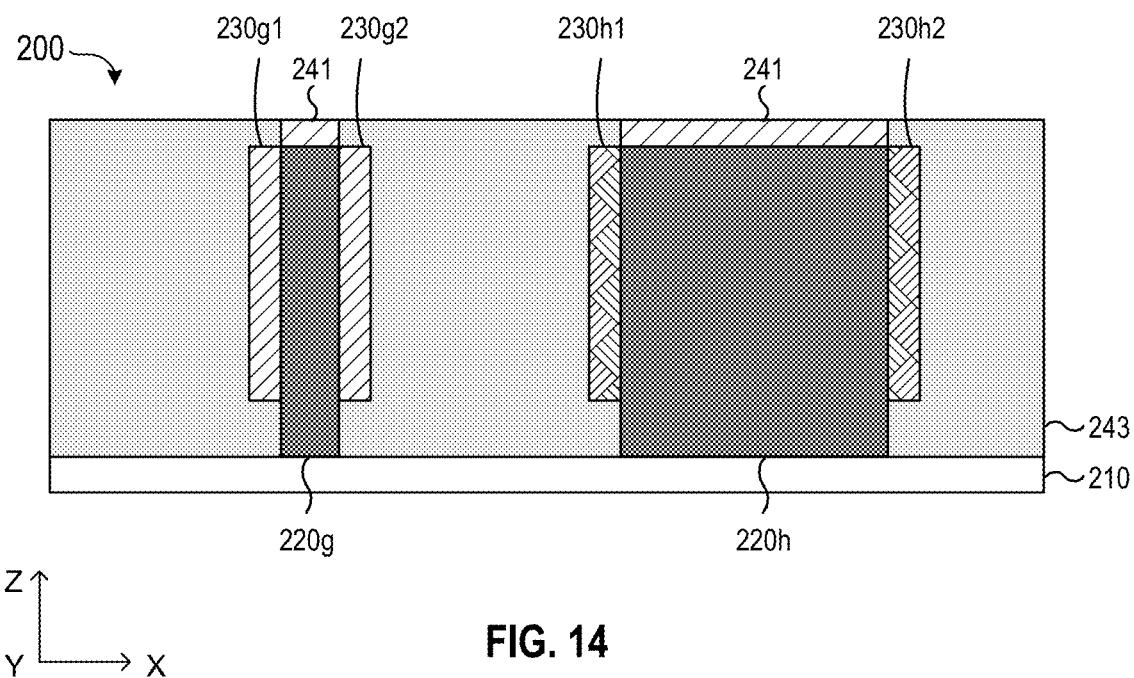

Then, the shell structures may be surrounded or covered with the second dielectric material, similar to FIG. 6A. In some examples, the second dielectric material may be different from the first dielectric material. In the example of FIG. 14, the second dielectric material and the first dielectric material are identical, and a CMP process may be used to planarize the second dielectric material. Herein, the CMP process stops at the capping layer 241. In other examples, top surfaces of the shell structures may be exposed by the CMP process.

Figure 15:
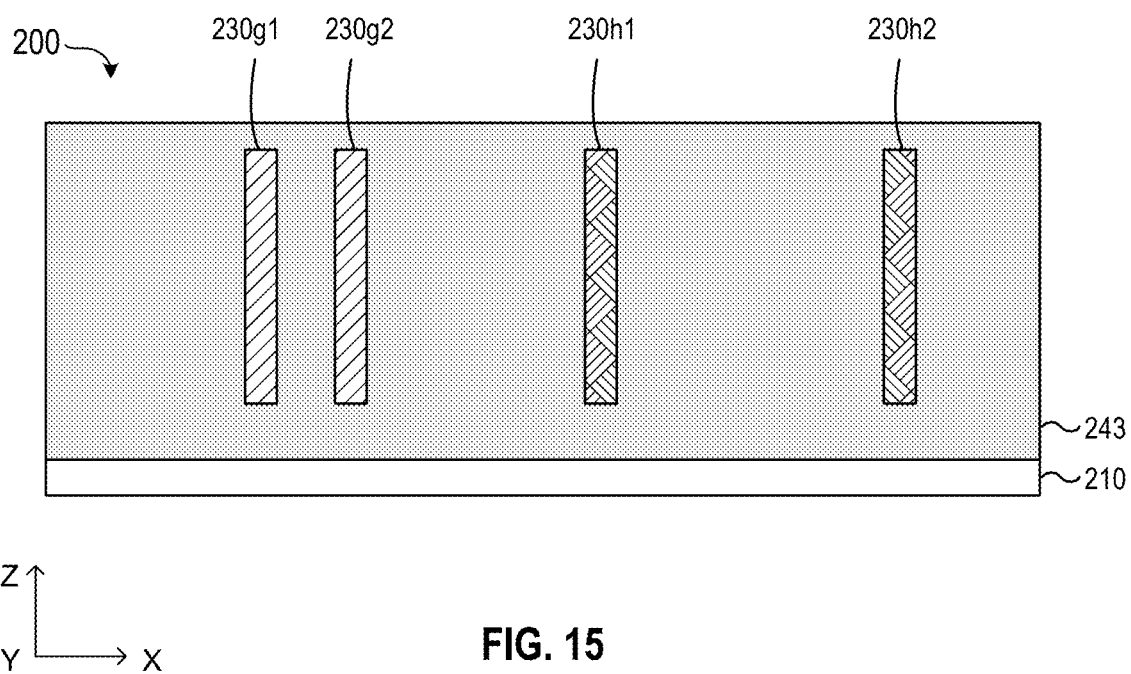

In FIG. 15, the core structures (e.g. 220g and 220h) are removed and may be replaced with the third dielectric material. As a result, the shell structures (e.g. 230g and 230h) are electrically isolated from each other and electrically isolated from the first layer 210, similar to FIG. 8A.

According to some aspects of the disclosure, the sub-shell structures (e.g. 230h1 and 230h2) formed around a common core structure (e.g. 220h) include the same semiconductor material, as shown in FIGS. 9-15. According to some aspects of the disclosure, the sub-shell structures formed around a common core structure can include different semiconductor materials. For instance, FIGS. 16 and 17 show cross-sectional views of the semiconductor device 200 at various intermediate steps of manufacturing, in accordance with exemplary embodiments of the present disclosure.

Figure 10:
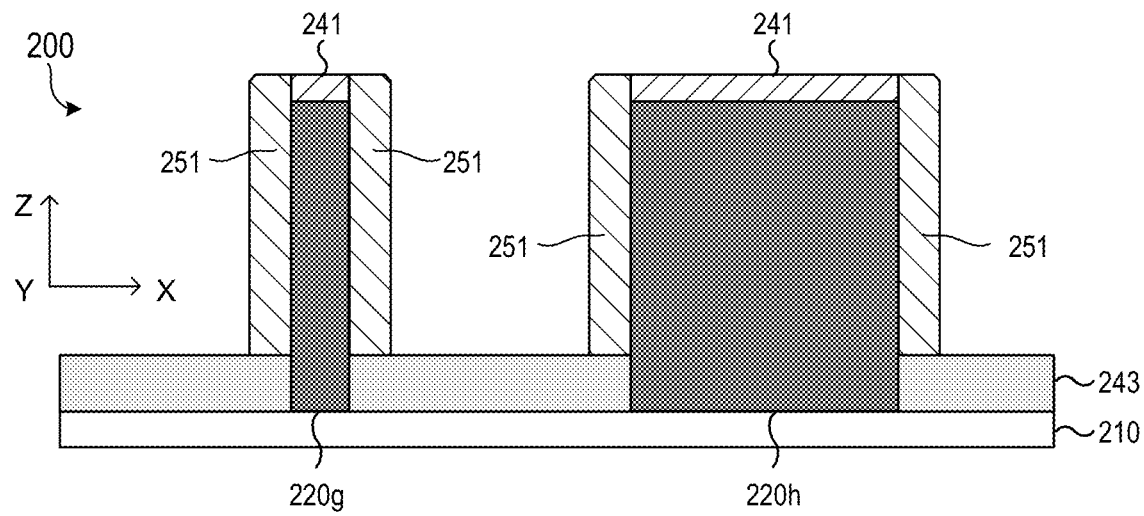
Figure 11:
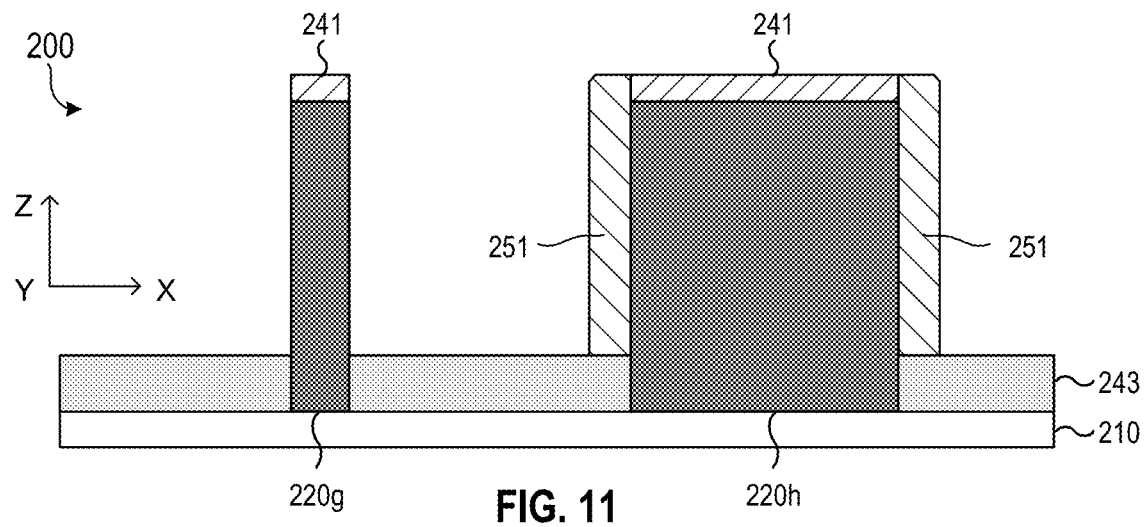
Figure 16:
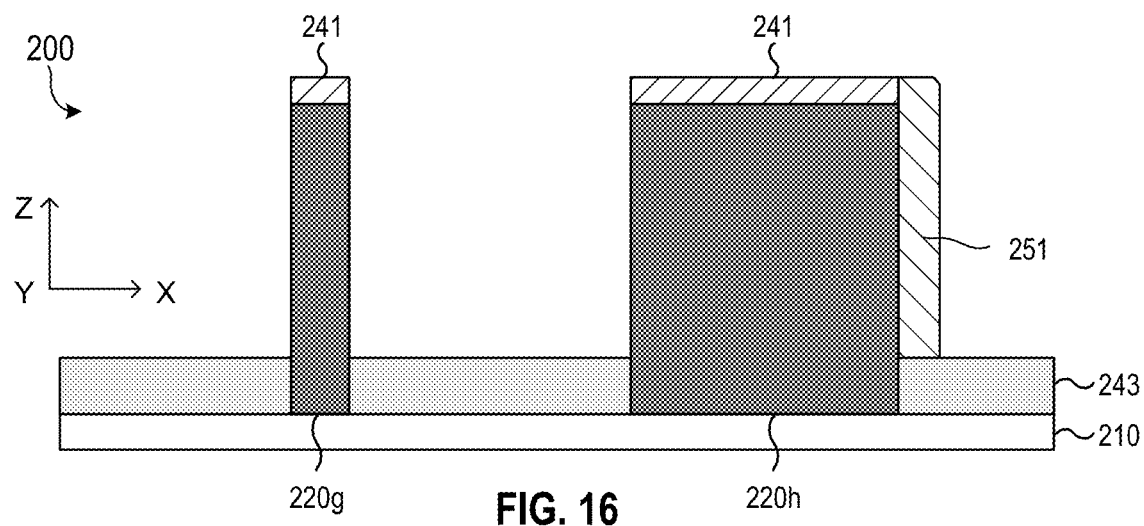
FIGS. 16 and 17 show cross-sectional views of a semiconductor device at various intermediate steps of manufacturing, in accordance with exemplary embodiments of the present disclosure.

In some embodiments, a process may start with FIG. 2 and then go to FIGS. 9 and 10 before proceeding to FIG. 16. In FIG. 16, the dielectric spacer 251 is removed such that the dielectric spacer 251 partially covers one or more of the core structures (e.g. 220h). The semiconductor device 200 can then go through processes, which are similar to FIGS. 12-15, including forming the first group of the shell structures, depositing the high-k dielectric, removing the dielectric spacer, forming the second group of the shell structures, removing the high-k dielectric, surrounding the shell structures with the second dielectric material, and removing or replacing the core structures. The processes have been described above and will be omitted here for simplicity purposes.

Figure 17:
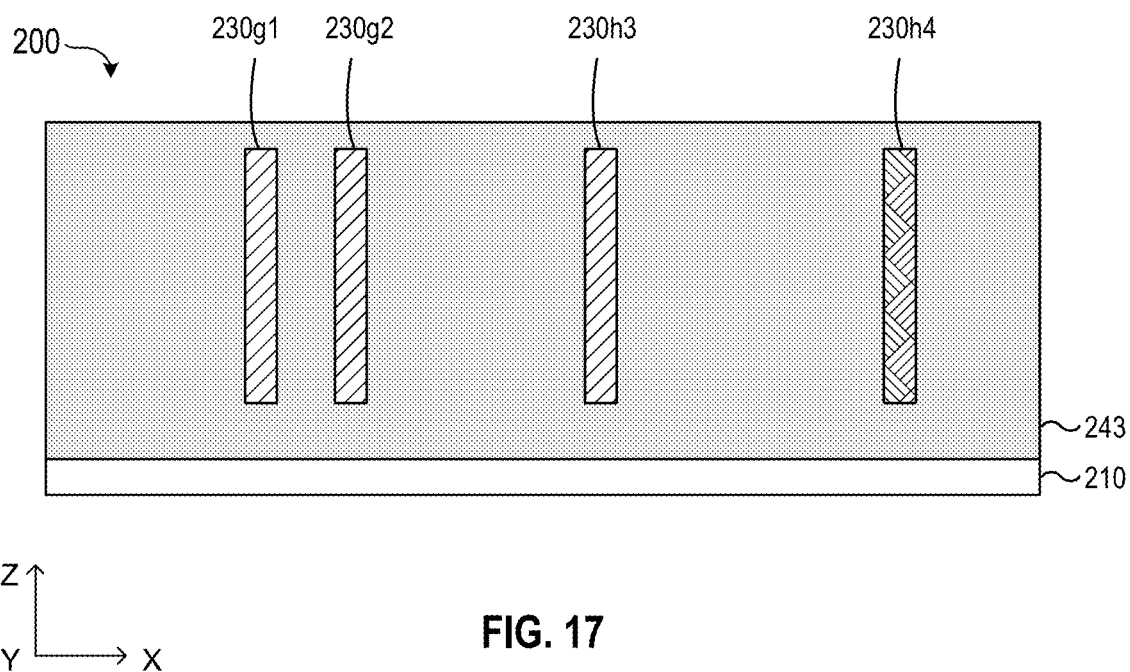

As a result, in FIG. 17, the first group of the shell structures (e.g. 230g and 230h3) and the second group of the shell structures (e.g. 230h4) are formed. Note that 230h3 and 230h4 can be referred to as sub-shell structures because 230h3 and 230h4 are formed around a common core structure 220h. 230h3 and 230h4 can also be referred to as shell structures because 230h3 and 230h4 are formed in different steps. That is, 230h3 belongs to the first group of the shell structures while 230h4 belongs to the second group of the shell structures.

Particularly, shell structures 230h3 and 230h4 can include different semiconductor materials. In one embodiment, the shell structures 230h3 and 230h4 are connected and together form a continuous shell structure all around the upper portions of the sidewalls of the core structure 220h, similar to the shell structure 230a. In another embodiment, the shell structures 230h3 and 230h4 are spaced apart, similar to the sub-shell structures 230b1 and 230b2.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of microfabrication, the method comprising:
providing a substrate having a first layer comprising a first semiconductor material;
forming a second layer of a second semiconductor material over the first layer;
directionally etching the second layer using a mask to form independent core structures of the second semiconductor material on the first semiconductor material, wherein each independent core structure has a sidewall extending from an exposed surface of the first layer;
forming a third layer of a first dielectric material on the exposed surface of the first layer to cover a lower portion of a respective sidewall of each core structure with the first dielectric material;
forming a shell structure on an upper portion of a respective sidewall of each core structure to form shell structures that include at least one type of semiconductor material; and
removing the core structures such that each shell structure forms a vertical semiconductor structure which extends vertically from the first layer and is electrically isolated from the first semiconductor material by the first dielectric material.

2. The method of claim 1, wherein the forming the shell structure comprises:
forming at least one continuous shell structure surrounding the upper portion of the sidewall of a respective core structure such that the continuous shell structure forms a closed shape in a plane parallel to the first layer.

3. The method of claim 2, wherein the removing the core structures comprises:
removing the respective core structure from within the continuous shell structure to form a hollow vertical semiconductor structure which extends vertically from the first layer.

4. The method of claim 2, wherein the closed shape is circular, elliptical or polygonal.

5. The method of claim 1, wherein the forming the shell structure comprises:
forming at least one discontinuous shell structure comprising independent sub-shell structures extending around the upper portion of the sidewall of a respective core structure such that the discontinuous shell structure forms a broken shape in a plane parallel to the first layer.

6. The method of claim 5, wherein the removing the core structures comprises:
removing the respective core structure from within the discontinuous shell structure to form independent vertical semiconductor structures which extend vertically from the first layer.

7. The method of claim 5, wherein:
the respective core structure is polygonal in a plane parallel to the first layer, and the independent sub-shell structures are formed on different sides of a respective polygon.

8. The method of claim 5, further comprising forming a dielectric isolation between the independent sub-shell structures.

9. The method of claim 1, wherein the directionally etching the second layer using the mask comprises:
forming a plurality of core structures including shapes of prisms having horizontal bases and vertical faces, wherein the horizontal bases are circular, elliptical or polygonal.

10. The method of claim 1, wherein the forming the shell structure comprises:
forming a first group of the shell structures on a first group of the upper portions of the sidewalls of the core structures while a second group of the upper portions of the sidewalls of the core structures is protected, the first group of the shell structures including a third semiconductor material.

11. The method of claim 10, further comprising:
forming a second group of the shell structures on the second group of the upper portions of the sidewalls of the core structures while the first group of the shell structures is protected, the second group of the shell structures including a fourth semiconductor material.

12. The method of claim 11, wherein the third semiconductor material and the fourth semiconductor material include different semiconductor materials, or the third semiconductor material and the fourth semiconductor material include a same semiconductor material but are doped differently.

13. The method of claim 1, wherein the forming the third layer of the first dielectric material comprises:
depositing the first dielectric material to cover the first layer; and
removing a portion of the first dielectric material so that the upper portions of the sidewalls of the core structures are uncovered.

14. The method of claim 1, wherein the forming the third layer of the first dielectric material comprises:
depositing the first dielectric material to cover the first layer and the sidewalls of the core structures; and
removing a portion of the first dielectric material using an etching mask so that the upper portions of the sidewalls of the core structures are partially uncovered.

15. The method of claim 1, wherein the removing the core structures comprises:
replacing the core structures with an insulating material by etching the core structures and depositing the insulating material.

16. The method of claim 1, further comprising:
forming a capping layer over the second layer so that top surfaces of the core structures are covered by the capping layer.

17. The method of claim 1, wherein each shell structure comprises a vertical channel that is configured to have a current flow path in a vertical direction perpendicular to the first layer.

18. The method of claim 1, wherein:
the first semiconductor material and the second semiconductor material are etch selective relative to each other, and
the core structures and the shell structures are etch selective relative to each other.

19. The method of claim 1, further comprising forming the shell structure by epitaxial growth.

20. The method of claim 1, further comprising forming the second layer over the first layer by epitaxial growth.

* * * * *